(12) United States Patent
Wu et al.

(10) Patent No.: US 8,801,446 B2
(45) Date of Patent: Aug. 12, 2014

(54) CONNECTOR ASSEMBLY

(71) Applicants: Hung-Yi Wu, New Taipei (TW); Lei Liu, Shenzhen (CN)

(72) Inventors: Hung-Yi Wu, New Taipei (TW); Lei Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 64 days.

(21) Appl. No.: 13/678,870

(22) Filed: Nov. 16, 2012

(65) Prior Publication Data

US 2014/0106620 A1    Apr. 17, 2014

(30) Foreign Application Priority Data

Oct. 16, 2012  (CN) .......................... 2012 1 03905478

(51) Int. Cl.
*H01R 27/00*   (2006.01)

(52) U.S. Cl.
USPC .......................................... 439/218; 439/222

(58) Field of Classification Search
USPC .......................................... 439/222, 218, 224
See application file for complete search history.

(56) References Cited

U.S. PATENT DOCUMENTS

| | | | | |
|---|---|---|---|---|
| 3,955,869 A * | 5/1976 | Licht | ............................ | 439/218 |
| 4,655,522 A * | 4/1987 | Beck et al. | ................... | 439/224 |
| 5,899,766 A * | 5/1999 | DeFeo | ......................... | 439/218 |
| 7,361,059 B2 * | 4/2008 | Harkabi et al. | ............... | 439/660 |
| 7,572,059 B2 * | 8/2009 | Lim | ............................... | 384/100 |
| 2009/0149049 A1 * | 6/2009 | Harkabi et al. | ............... | 439/218 |

\* cited by examiner

*Primary Examiner* — Gary Paumen
(74) *Attorney, Agent, or Firm* — Novak Druce Connolly Bove + Quigg LLP

(57) ABSTRACT

A connector assembly includes a female connector and a mal connector. The female connector includes a first main body and a number of slots defined in the first main body, and each slot receives a conductive terminal therein. First and second row conductive terminals are arranged along an opposite direction. A number of cables are attached to the first main body and electrically connected to the conductive terminals. A male connector includes a second main body and a number of conductive pins extend through the second main body. Third row conductive pins are corresponding to the first row conductive terminals. Fourth row conductive pins are corresponding to the second row conductive terminals. The connector assembly can transmit signals normally whatever the male connector is plugged to the female connector.

4 Claims, 3 Drawing Sheets

CONNECTOR ASSEMBLY

BACKGROUND

1. Technical Field

The present disclosure relates to connector assemblies, and particularly to a universal serial bus (USB) connector assembly.

2. Description of Related Art

In general, a USB male connector arranged on a computer motherboard includes two groups of USB signal pins, to transmit two groups of USB signals. Each group of USB signal pin includes a voltage pin +5V, a first signal pin S+, a second signal pin S−, and a ground pin GND. In order to assure a correct signal transmission, a shielding pin and a foolproof pin are arranged on the USB male connector. However, different USB connectors may arrange the shielding pin and the foolproof pin in different location, thus, a male USB connector needs to use a specific USB female connector to connect, to result in low versatility and high cost.

BRIEF DESCRIPTION OF THE DRAWINGS

Many aspects of the embodiments can be better understood with reference to the following drawings. The components in the drawing are not necessarily drawn to scale, the emphasis instead being placed upon clearly illustrating the principles of the present embodiments.

DETAILED DESCRIPTION

Figure 1:
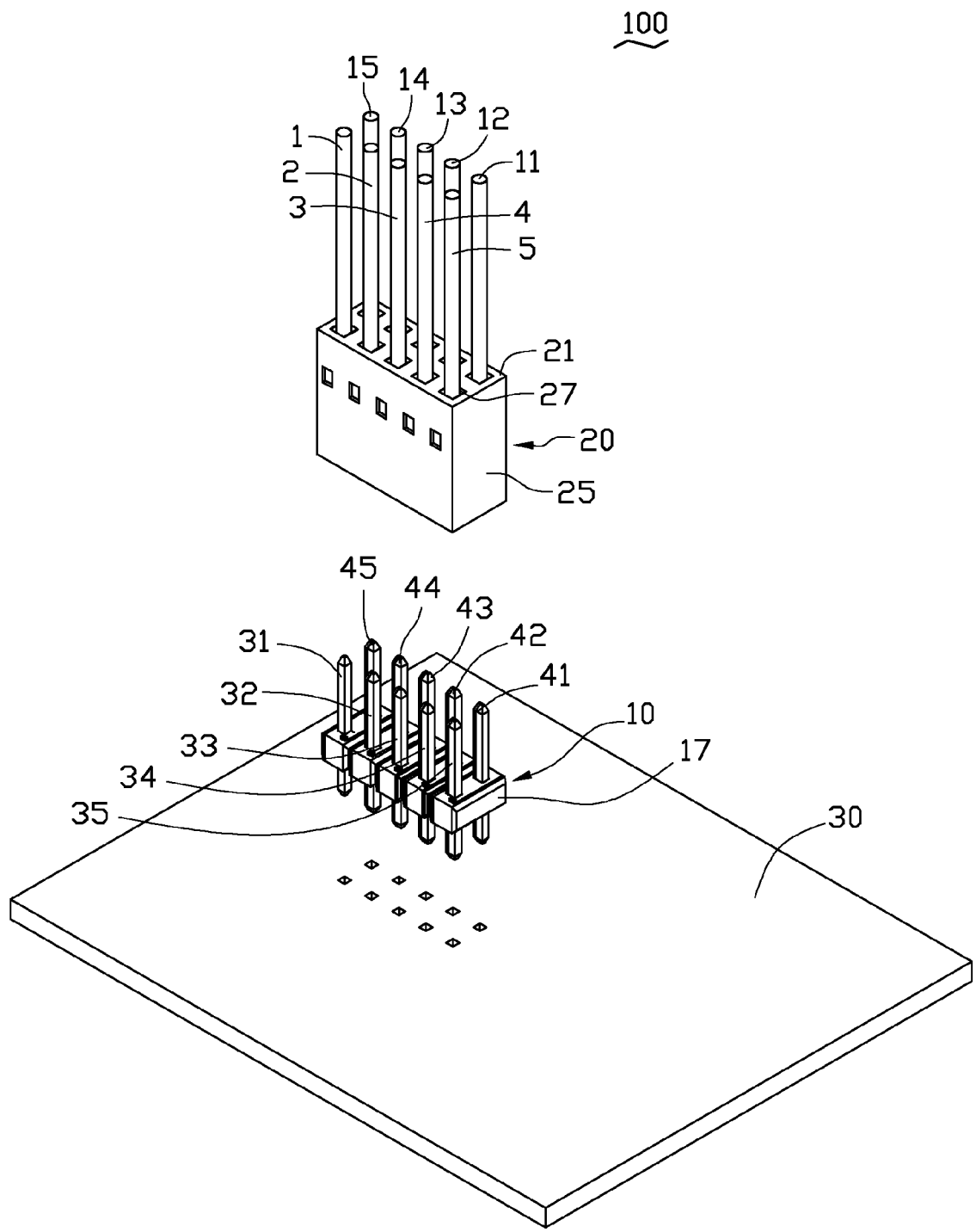
FIG. 1 is an exploded, isometric view of a connector assembly in accordance with an exemplary embodiment of the present disclosure; the connector assembly includes a male connector and a female connector.

The disclosure, including the drawing, is illustrated by way of example and not by way of limitation. References to "an" or "one" embodiment in this disclosure are not necessarily to the same embodiment, and such references mean at least one.

Figure 2:
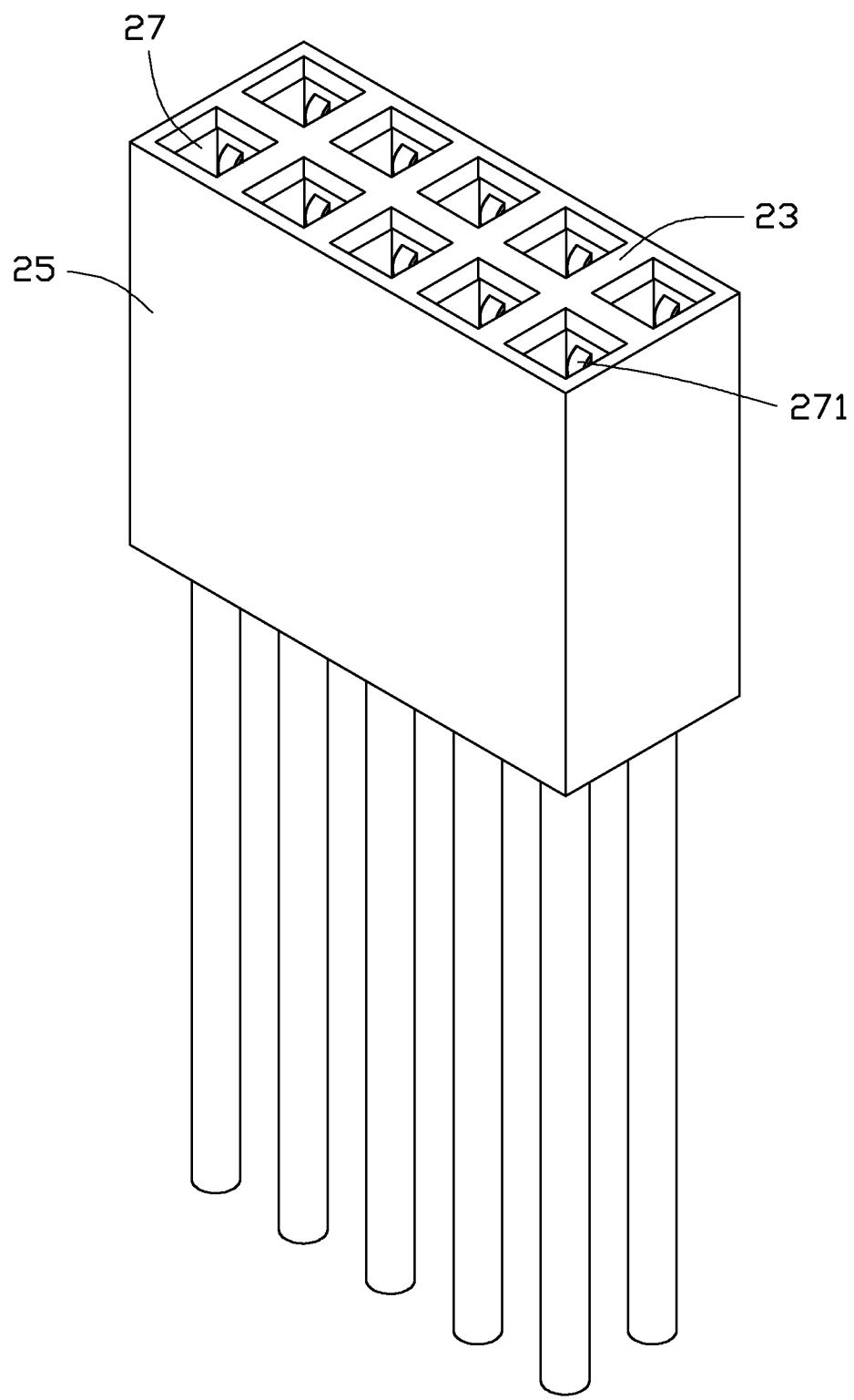
FIG. 2 is another view of the female connector of FIG. 1.
Figure 3:
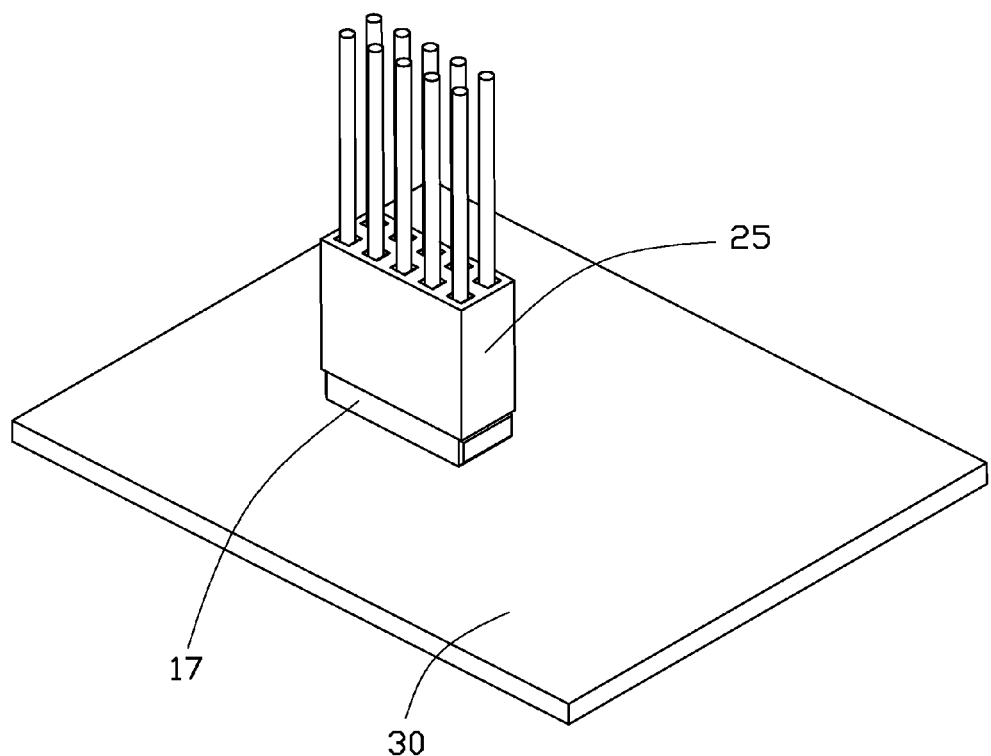
FIG. 3 is an assembled, isometric view of FIG. 1.

Referring to FIGS. 1 to 3, a connector assembly 100 in accordance with an exemplary embodiment includes a male connector 10 and a female connector 20 to receive the male connector 10.

The female connector 20 includes a main body 25 and a plurality of cables (in one embodiment, such as cables 1-5 and 11-15) connected to the main body 25. A plurality of slots 27 is defined in the main body 25 and extends from a top wall 21 to a bottom wall 23 of the main body 25. In one embodiment, the slots 27 are arranged in two rows in the main body 25 and each row includes five slots 27. Each slot 27 receives a conductive terminal 271 therein. The first row conductive terminals includes a voltage terminal, a first signal terminal, a second signal terminal, a ground terminal, and a fielding terminal arranged in order along a first direction and connected to the cables 1-5 respectively. The second row conductive terminals includes a voltage terminal, a first signal terminal, a second signal terminal, a ground terminal, and a fielding terminal arranged in order along a second direction opposite to the first direction and connected to the cables 11-15 respectively.

The male connector 10 includes a main body 17 and a plurality of conductive pins 31-35 and 41-45. The conductive pins 31-35 and 41-45 are formed on the main body 17 and extend through the main body 17. The conductive pins 31-35 and 41-45 are arranged in two rows in the main body 17. The conductive pins 31-35 are arranged in a first row and corresponding to the cables 1-5 of the female connector 20, that is, the conductive pins 31-35 are respectively a voltage pin, a first signal pin, a second signal pin, a ground pin, and a fielding pin. The conductive pins 41-45 are arranged in a second row and corresponding to the cables 11-15 of the female connector 20, that is, the conductive pins 41-45 are respectively a voltage pin, a first signal pin, a second signal pin, a ground pin, and a fielding pin. First ends of the conductive pins 31-35 and 41-45 can be inserted in the slots 27 of the female connector 20, to electrically connect to the cables 1-5 and 11-15 of the female connector 20. Second ends of the conductive pins 31-35 and 41-45 are electrically connected to a motherboard 30.

In assembly, the male connector 10 is mounted on the motherboard 30 through the second ends of the conductive pins 31-35 and 41-45, and then the female connector 20 is attached to the male connector 10 to electrically connect the conductive terminals 271 to the first ends of the conductive pins 31-35 and 41-45 of the male connector 10. When the female connector 20 is connected to the male connector 10 in a first direction, namely, the cables 1-5 of the female connector 20 are connected to the conductive pins 31-35 of the male connector 10 and the cables 11-15 of the female connector 20 are connected to the conductive pins 41-45 of the male connector 10. The voltage signal in the first row of the female connector 20 is transmitted through the cable 1 and the conductive pin 31. The first signal in the first row of the female connector 20 is transmitted through the cable 2 and the conductive pin 32. The second signal in the first row of the female connector is transmitted through the cable 3 and the conductive pin 33. The ground signal in the first row of the female connector is transmitted through the cable 4 and the conductive pin 34. The shielding signal in the first row of the female connector is transmitted through the cable 5 and the conductive pin 35. The voltage signal in the second row of the female connector 20 is transmitted through the cable 11 and the conductive pin 41. The first signal in the second row of the female connector 20 is transmitted through the cable 12 and the conductive pin 42. The second signal in the second row of the female connector is transmitted through the cable 13 and the conductive pin 43. The ground signal in the second row of the female connector is transmitted through the cable 14 and the conductive pin 44. The shielding signal in the second row of the female connector is transmitted through the cable 15 and the conductive pin 45.

When the female connector 20 is connected to the male connector 10 in a second direction opposite to the first direction (such as the female connector 20 is rotated 180 degrees angle), namely, the cables 1-5 of the female connector 20 are electrically connected to the conductive pins 41-45 of the male connector 10 and the cables 11-15 of the female connector 20 are electrically connected to the conductive pins 31-35 of the male connector 10. The voltage signal in the first row of the female connector 20 is transmitted through the cable 1 and the conductive pin 41. The first signal in the first row of the female connector 20 is transmitted through the cable 2 and the conductive pin 42. The second signal in the first row of the female connector is transmitted through the cable 3 and the conductive pin 43. The ground signal in the first row of the female connector is transmitted through the cable 4 and the conductive pin 44. The shielding signal in the first row of the female connector is transmitted through the cable 5 and the conductive pin 45. The voltage signal in the second row of the female connector 20 is transmitted through the cable 11 and the conductive pin 31. The first signal in the second row of the female connector 20 is transmitted through the cable 12 and the conductive pin 32. The second signal in the second row of the female connector is transmitted through the cable 13 and the conductive pin 33. The ground signal in the second row of the female connector is transmitted through the cable 14 and the conductive pin 34. The shielding signal in the second row of the female connector is transmitted through the cable 15 and the conductive pin 35.

The connector assembly 100 can transmit signals whatever the male connector 10 is plugged to the female connector 20, to improve versatility and lower cost.

Even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A connector assembly comprising:
   a female connector comprising:
     a first main body;
     a plurality of slots defined in the first main body and extending through the first main body, wherein the plurality of slots are arranged in a first row and a second row that is parallel to the first row, each of the first and second rows has the same number of slots, each slot receives a conductive terminal therein, the first row of conductive terminals are arranged along a first direction, and the second row of conductive terminals are arranged along a second direction opposite to the first direction; and
     a plurality of cables attached to the first main body and electrically connected to the conductive terminals;
   a male connector comprising:
     a second main body; and
     a plurality of conductive pins arranged in the second main body and extending through the second main body, wherein the plurality of conductive pins are arranged in a third row and a fourth row parallel to the third row, each of the third and fourth rows has the same number of conductive pins, third row conductive pins correspond to the first row conductive terminals of the female connector, fourth row conductive pins correspond to the second row conductive terminals of the female connector;
   when the female connector is connected to the male connector in a third direction, the first row conductive terminals of the female connector are electrically connected to the third row conductive pins of the male connector, the second row conductive terminals of the female connector are electrically connected to the fourth row conductive pins of the male connector; and when the female connector is connected to the male connector in a fourth direction opposite to the third direction, the first row conductive terminals of the female connector are electrically connected to the fourth row conductive pins of the male connector, and the second row conductive terminals of the female connector are electrically connected to the third row conductive pins of the male connector.

2. The connector assembly of claim 1, wherein the male connector and the female connector are universal serial bus connectors.

3. The connector assembly of claim 2, wherein each row of the male connector comprises five conductive terminals, and each row of the female connector comprises five conductive pins.

4. The connector assembly of claim 3, wherein the first row conductive terminals of the female connector comprises a voltage terminal, a first signal terminal, a second signal terminal, a ground terminal, and a shielding terminal arranged in order along the first direction;
   the second row conductive terminals of the female connector comprises a voltage terminal, a first signal terminal, a second signal terminal, a ground terminal, and a shielding terminal arranged in order along the second direction;
   the third row conductive pins of the male connector comprises a voltage pin, a first signal pin, a second signal pin, a ground pin, and a shielding pin arranged in order along the first direction; and
   the fourth row conductive pins of the male connector comprises a voltage pin, a first signal pin, a second signal pin, a ground pin, and a shielding pin arranged in order along the second direction.

* * * * *